United States Patent [19]

Weitekamp et al.

[11] Patent Number: 4,710,714

[45] Date of Patent: Dec. 1, 1987

[54] METHOD AND APPARATUS FOR MEASURING NUCLEAR MAGNETIC PROPERTIES

[75] Inventors: Daniel P. Weitekamp, 39 Kenyon Ave., Kensington, Calif. 94708; Anthony Bielecki; David B. Zax, both of Berkeley, Calif.; Kurt W. Zilm, Hamden, Conn.; Alexander Pines, Berkeley, Calif.

[73] Assignees: The Regents of the University of California; Daniel Paul Weitekamp, both of Berkeley, Calif.

[21] Appl. No.: 598,844

[22] Filed: Apr. 10, 1984 (Under 37 CFR 1.47)

[51] Int. Cl.[4] .................................. G01R 33/20
[52] U.S. Cl. ................................ 324/307; 324/313
[58] Field of Search ............ 324/300, 307, 313, 318, 324/319, 322

[56] References Cited

U.S. PATENT DOCUMENTS

| 2,984,782 | 5/1961 | Dicke | 324/307 |
| 3,052,834 | 9/1962 | Schuster | 324/313 |
| 3,714,551 | 1/1973 | Pajak et al. | 324/313 |
| 3,774,103 | 11/1973 | Laukien | 324/313 |
| 4,573,015 | 2/1986 | Abe et al. | 324/309 |

Primary Examiner—Michael J. Tokar
Attorney, Agent, or Firm—Fitch, Even, Tabin & Flannery

[57] ABSTRACT

A method for studying the chemical and structural characteristics of materials is disclosed. The method includes placement of a sample material in a high strength polarizing magnetic field to order the sample nucleii. The condition used to order the sample is then removed abruptly and the ordering of the sample allowed to evolve for a time interval. At the end of the time interval, the ordering of the sample is measured by conventional nuclear magnetic resonance techniques.

29 Claims, 5 Drawing Figures

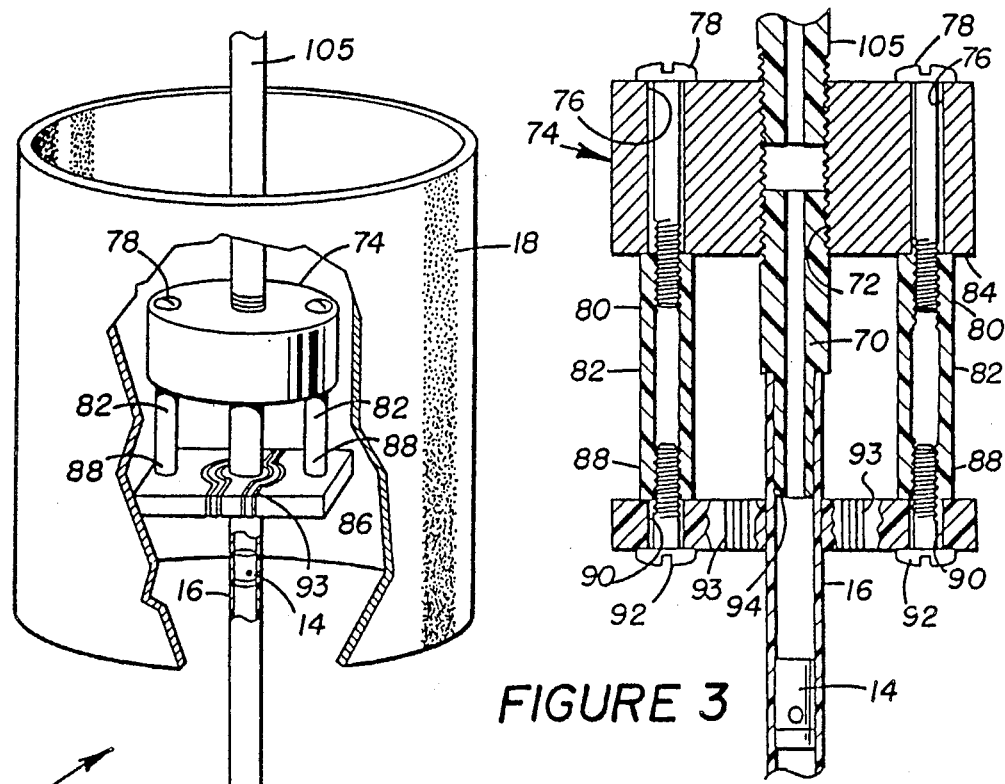
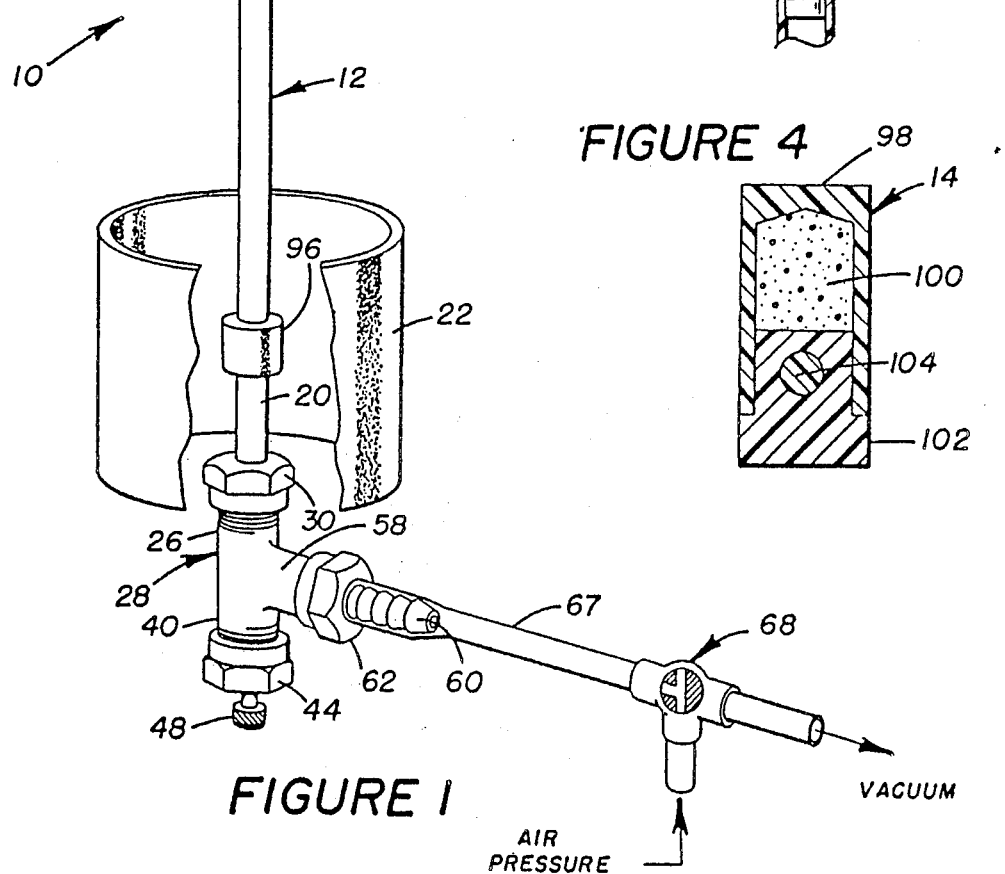

METHOD AND APPARATUS FOR MEASURING NUCLEAR MAGNETIC PROPERTIES

This invention was made with Government support under contract number DE-AC03-76SF00098 awarded by the Department of Energy. The Government has certain rights in this invention.

The present invention relates generally to nuclear magnetic resonance and more particularly to novel methods and apparatus for measuring nuclear magnetic properties.

BACKGROUND OF THE INVENTION

Nuclear magnetic properties generally refer to the local magnetic and electric fields which atoms exert upon each other. The local magnetic and electric fields are a sensitive probe of the local environment and the chemical structure of the substance of which the atoms compose. However, these fields are generally too weak to be probed directly. An attempt to probe these fields usually results in a severe loss or distortion of information. The fields produced by the apparatus used to probe the local magnetic and electric fields, or even the earth's own magnetic field, may "mask" the local fields which are desired to be measured.

The techniques of nuclear magnetic resonance (NMR) and nuclear quadrupole resonance (NQR) have been developed and provide a valuable tool for determining molecular structure characteristics. These molecular structural characteristics are useful in determining factors which influence chemical changes.

The typical prior art nuclear magnetic resonance detection system operates by first placing the sample to be measured within a relatively high magnetic field. The magnetic field causes the magnetic dipoles at the atomic level to align their axis within this field. The axis is the nuclear spin axis of each nuclei. After the sample has been exposed to the magnetic field for a sufficient time, the sample reaches magnetic equilibrium. Once equilibrium has been obtained, the local magnetic fields may be measured. The measurement usually consists of a radio frequency detector which is scanned across the sample. The frequency emitted by each magnetic dipole is unique for each atomic element present in the molecular structure. Thus, the chemical structure of the sample is determined by the spectrum of radio frequencies detected by the RF detector.

One particularly useful application for NMR detection is to study the effects of catalyst materials. It is highly desirable to be able to predict when a material will exhibit catalytic behavior, and furthermore, to predict the most favorable conditions to optimize the results of the catalytic behavior. However, the use of prior known NMR and NQR detection techniques for analyzing the molecular structures of solid materials has presented several limitations and disadvantages. For example, prior NMR procedures for the studies of solids usually have required the use of a single crystal or oriented sample. However, many solids which are desired to be measured are not single crystal or oriented samples. For example, it is desirable to determine the molecular structure of powdered samples or amorphous samples. Furthermore, known prior art methods and apparatus for obtaining NMR spectra usually have a disadvantage and limitation in crystallography and molecular structure determination in polycrystalline or disordered materials.

SUMMARY OF THE INVENTION

Accordingly, it is an object of the present invention to overcome one or more of the disadvantages and limitations enumerated above.

It is an important object of the present invention to provide novel methods and apparatus for measuring nuclear magnetic properties of solids which are not single crystal or oriented samples.

It is a further object of the present invention to provide novel methods and apparatus for NMR detection which are also useful for the determining of molecular structure of powdered samples.

According to the present invention, nuclear magnetic properties of the sample are determined by first polarizing the sample within a relatively high magnetic field to obtain equilibrium of the magnetic dipoles within such sample. The magnetic field is then gradually reduced in intensity so that the sample is then within an intermediate field. The intermediate field intensity is selected to be sufficient to maintain the polarization of the sample. The magnetic field about the sample is then reduced to substantially zero for a selected period of time wherein the spin axis orientation of the sample may freely decay. At the expiration of the selected time, the magnetic field to which the sample is subjected is returned to a high field intensity. The RF energy emitted by the sample may then be detected using conventional NMR sampling techniques.

In a further aspect of the present invention, the sample data is then Fourier-transformed which provides a frequency spectrum which identifies the nuclear properties and molecular structure of the measured sample.

In another aspect of the present invention, means are provided to transport the sample between the regions of high magnetic field and zero field. Such means may be carried out pneumatically. For example, the sample may be placed within a pneumatic tube, with the tube pressure being switched between vacuum and pressure to transport the sample.

Another aspect of the present invention uses switching electromagnets to produce the various fields about a stationary sample.

The method and apparatus of the present invention is particularly useful for determining the molecular structure of powdered solids. The utility of the present invention also extends to improved measurements of monocrystalline or oriented samples of solids as well as amorphous solids and fluids. The present invention is also well adapted to the study of catalysis. Other useful applications of the present invention outside the study of catalysis includes where solid molecular structure and surface characteristics are important, such as in biological and medical applications. A typical medical application would be the study of drug applications. The invention is also useful in material sciences such as the study of semiconductors. Furthermore, the method and apparatus of the present invention is also useful in geological and earth sciences, such as the study of minerals.

Other objects, advantages and features of the present invention will become more apparent from a study of the following description and appended claims when read in conjunction with the following drawings, wherein:

BRIEF DESCRIPTION OF THE DRAWINGS

FIG. 1 illustrates an apparatus constructed according to the principles of the present invention;

FIG. 3 is another view, in cross section, illustrating another detail of the apparatus of FIGURE 1;

FIG. 4 is a view, in cross section, illustrating the sample from which NMR data is collected within a sample holder.

DETAILED DESCRIPTION OF THE DRAWINGS

Figure 5:
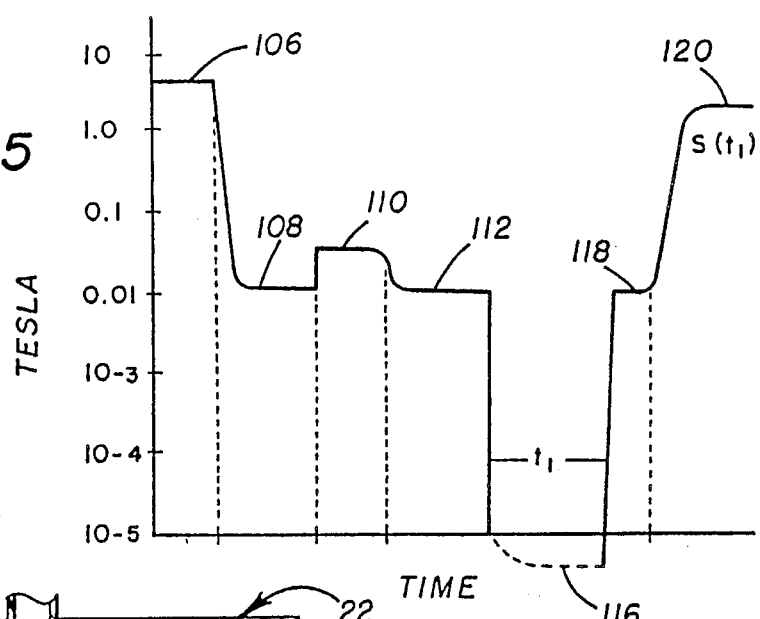
FIG. 5 illustrates the relative field intensities of the magnetic field to which the sample to be measured is subjected to in a time domain basis.

The present invention has been disclosed and described by the named inventors herein in a publication entitled "Zero Field Nuclear Magnetic Resonance", *Physical Review Letters*, volume 50, no. 22, pages 1807–10, May 30, 1983, which is incorporated herein by reference. The referenced publication illustrates that the techniques for determining molecular structure, such as x-ray diffraction and nuclear magnetic resonance, are sensitive to inter atomic distances and angles. Such techniques often require the use of single crystals or oriented samples. Where the sample consists of polycrystalline powders or amorphous materials, a distribution of molecular orientations, and thus the internuclear vectors, with respect to the direction defined by the x-ray beam or by the magnetic field give rise to a "powder pattern" in which most structural information is lost. Another example of the utility of the prersent invention is given in "Fourier transform pure nuclear quadrupole resonance by pulsed field cycling", *Journal of Chemical Physics*, Vol. 80, No. 5, 1 Mar. 1984, pp. 2232–2234, which is co-authored, inter alia, by the inventor-designees herein, and is incorporated herein by reference.

Referring now to FIG. 1, there is shown an apparatus 10 constructed according to the principles of the present invention. Apparatus 10 includes an elongated pneumatic tube 12 in which a sample holder 14 is received in slidable engagement. An upper end portion 16 of pneumatic tube 12 is disposed within a commercially available superconducting magnet 18 of generally cylindrical shape and disposed co-axially with pneumatic tube 12. Superconducting magnet 18 develops a magnetic field having a selected field intensity about upper end portion 16. Disposed about the lower end portion 20 of pneumatic tube 12 is a shielding magnet 22. Shielding magnet 22 selectively develops another magnetic field having a selected field intensity about lower end portion 20. By switching the pressure within pneumatic tube 12 between positive and negative values, sample holder 14 will be transported between the regions of different magnetic field intensities at its upper end portion 16 and its lower end portion 20.

Received within lower end portion 20 of pneumatic tube 12 is a cylindrical plug 24 having a radial dimension selected to be less than the inside radial dimension of pneumatic tube 12 so that an air gap exists between its surface and the inside surface of pneumatic tube 12. Lower end portion 20 of pneumatic tube 12 is received by a first branch 26 of a T-fitting 28. T-fitting 28 receives a first retaining cap 30 which is threadedly engaged to first branch 26. Retaining cap 30 has an opening 32 dimensioned to receive pneumatic tube 12. First branch 26 of T-fitting 28 has a counterbore 34. Disposed within counterbore 34 is an O-ring 36 dimensioned to sealingly engage first branch 26 and lower end portion 20 of pneumatic tube. O-ring 36 is held in place by a seal 38 which has a cylindrical portion disposed in the gap between counterbore 34 and pneumatic tube 12. Seal 38 further has a flange portion engaged by end cap 30. As end cap 30 is threadedly received by first branch 26, seal 38 compresses O-ring 36.

A second branch 40 of T-fitting 28 receives an end plug 42 which sealingly engages second branch 40. A second end cap 44 is threadedly received by second branch 40 to secure end plug 42 in place. End plug 42 has a threaded bore 46 in which an adjustment screw 48 is threadedly received. An upper end 50 of adjustment screw 48 is mounted into by a bore 52 of a lower end portion 54 of cylindrical plug 24 in slidable engagement. Adjustment of adjusting screw 48 determines the position of upper end portion 56 of cylindrical plug 24 within pneumatic tube 12. Thus, adjustment screw 48 and cylindrical plug 24 provide means for adjusting the position of sample holder 14 within pneumatic tube 12 when sample holder 14 comes to rest on upper end portion 56.

A third branch 58 of T-fitting 28 is dimensioned to receive a standard hose adaptor 60. The third end cap 62 has an opening 64 through which hose adaptor 60 is disposed. End cap 62 is further threadedly received by third branch 58 to secure hose adaptor 60 within third branch 58 and to sealingly compress a second O-ring 66.

Hose adaptor 60 sealingly receives one end of a hose 67. The other end of the hose 67 is sealingly attached to a conventional switching valve 68. For example, switching valve 68 may be operated by a solenoid (not shown). The solenoid may be controlled and selectively energized by a computer or other means which times the energization currents to the solenoid. Such means will become apparent from one skilled in the art from the following description of the operation of the apparatus and the method of the present invention. When switching valve 68 is in a first position, it allows the interior of pneumatic tube 12 to be in communication with a source of vacuum as illustrated in FIG. 4. When switching valve 68 is in its second position, it allows the interior of pneumatic tube 12 to be in communication with a source of high pressure. Thus, switching valve 68 provides means for pressurizing pneumatic tube 12 to pneumatically push sample holder 14 to the upper end portion 16 of pneumatic tube 12 and to evacuate pneumatic tube 12 to cause sample holder 14 to be pneumatically drawn to lower end portion 20 of pneumatic tube 12. The source of pressure and vacuum are selected to be sufficient to transport sample holder 14 within pneumatic tube 12. In one embodiment of the present invention, pneumatic tube 12 may operate between −10 and 10 psi.

Upper end portion 16 of pneumatic tube 12 receives an end plug 70. End plug 70 has a bore axially therethrough communicating the interior of pneumatic tube 12 above sample holder 14 exteriorly of pneumatic tube 12. End plug 70 has a threaded portion 72 disposed exaternally of pneumatic tube 12 which threadedly receives a mounting base 74. Mounting base 74 has a pair of bores 76 radially spaced from the axis of pneumatic tube 12. A threaded fastener 78 is received through each bore 76. A first end 80 of a plastic spacer tube 82 is threadedly secured to fastener 78 and mounted against a lower face 84 of mounting base 74.

A mounting block 86 is secured to a second end 88 of each one of spacer tubes 82. NMR detection coil has a plurality of bores 90 axially aligned with spacer tubes 82. A fastener 92 is received through each one of bores 90 and threadedly engages second end 88 of spacer tube 82.

Mounting block 86 carries a NMR resonance detection coil 93 thereon. The space between mounting base 74 and mounting block 86 is provided to conveniently locate a circuit card (not shown) which carries the necessary electronics of a conventional NMR RF detector of which detection coil is a part.

An edge portion 94 of end plug 70 disposed within pneumatic tube 12 determines the upper limit of travel of sample holder 14. It is desired that sample holder 14 be disposed within NMR detection coil 93 when the interior of pneumatic tube 12 communicates with the source of pressure. Threaded adjustment of mounting base 74 about threaded portion 72 of end plug 70 axially adjusts the position of NMR detection coil 93 with respect to edge portion 94 by having NMR detection coil 93 mounted to mounting base 74.

Disposed within shielding magnet 22 and attached circumferentially about pneumatic tube 12 is a rapid shut off magnet 96. Rapid shut off magnet 96 is disposed proximate to upper end portion 56 of cylindrical plug 24. When the interior of pneumatic tube 12 communicates with the source of vacuum and sample holder 14 is disposed against plug 24, adjustment screw 48 provides adjustment to maintain sample holder within the magnetic field of rapid shut off magnet 96.

Sample holder 14, best seen in FIG. 4, comprises a cylindrical holder dimensioned to be slidably received within pneumatic tube 12. In a preferred embodiment of the present invention, sample holder 14 is constructed of nonferromagnetic and nonmetallic material and has a cup portion 98 which holds a powdered sample 100. Sample holder 14 further includes a plug 102 which sealingly received by cup portion 98 to form an interior chamber in which powdered sample 100 is contained. A pin 104 may be provided to secure plug 102 to cup portion 98.

A mounting tube 105 may also be threadedly engaged to mounting base 74 and have an opening to communicate with pneumatic tube 12 above sample holder 14. Mounting tube 105 provides mounting at its upper end (not shown) to the interior of superconducting magnet 18 and provide venting of pneumatic tube 12 as sample holder 14 is pneumatically transported.

There has been hereinabove described the basic construction of the apparatus according to the present invention. The description of the method according to the present invention and the description of the method for using the above described apparatus hereinafter follows.

Figure 2:
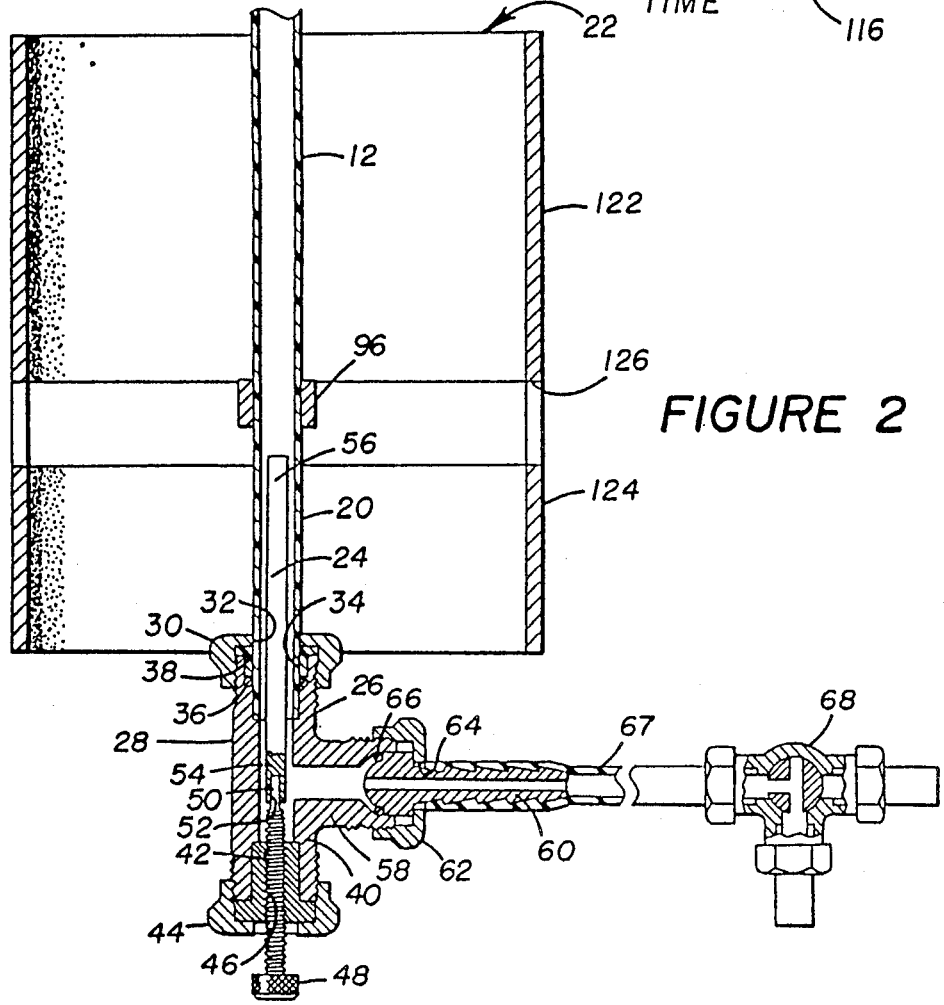
FIG. 2 is a view, in cross section, illustrating in greater detail a portion of FIG. 1.

To initially polarize the sample 100 within sample holder 14, switching valve 68 is put into its second position to pressurize the interior of pneumatic tube 12, thereby forcing sample holder 14 into upper end portion 16 of pneumatic tube 12 and against edge portion 94 of end plug 70. Superconducting magnet 18 is energized so that sample holder is subjected to a first field intensity. In a preferred embodiment of the present invention, the select first field intensity is 4.2 Tesla as illustrated in FIG. 5 at 106. When the magnetic dipoles within sample 100 have reached equilibrium, i.e. all spin axes aligned within the magnetic field, switching valve 68 is put into its first position to evacuate the interior of pneumatic tube 12 and to move the sample holder to its lower end portion 20. At this time, both the shielding magnet 96 and the rapid shut off magnet are in an off position and the magnetic field in which sample holder 14 is located drops to a second selected field intensity as indicated at 108. In a preferred embodiment of the present invention, the selected second field intensity is 0.01–0.03 Tesla. This second selected field intensity is selected to be sufficient to retain the sample 100 in a polarized condition. Rapid shut off magnet 96 is energized to bring the magnetic field to a third selected field intensity as illustrated at 110 in FIG. 2. In a preferred embodiment of the present invention, the third selected field intensity is 0.02–0.06 Tesla. After a selected time, shielding magnet 22 is energized so that the polarizing field is returned to a selected fourth field intensity. In a preferred embodiment of the present invention, the selected fourth field intensity is 0.01–0.03 Tesla as indicated at 112 in FIG. 2.

Of course, the operation of shielding magnet 22 and rapid shut off magnet 96 may not be as above described. For example the rapid shut off magnet could be energized when sample holder 14 is pneumatically moved to the lower end portion 20 of pneumatic tube 12. If this is the case, shielding magnet 22 could then be on or off. It is only necessary in practicing the present invention is that that sample 100 after reaching an equilibrium polarized condition is subjected to a field sufficient to maintain the polarized condition. Furthermore, the timing of the selective energization of shielding magnet 22 and rapid shut off magnet 96 may also be controlled by the computer or other means which controls the timing of switching valve 68.

At the beginning of time $t_1$, rapid shut off magnet 96 is turned off so that the field intensity drops to a selected fifth field intensity rapidly, illustrated at 116. In a preferred embodiment of the present invention, the selected fifth field intensity
is below $10^{-5}$ Tesla, or substantially, zero field as it is hereinafter described.

When sample 100 is within zero field, it is completely influenced magnetically by its own nuclear magnetic forces which causes the polarization of the sample to evolve. The time, $t_1$, is exactly determined and after time duration $t_1$ lapses, rapid shut off magnet 96 is energized and the polarization of the sample after evolving is "frozen" into the orientation existing at the end of time, $t_1$. When rapid shut off magnet 96 is energized, the polarizing field is returned to a sixth selected field intensity as indicated at 118. In the preferred embodiment of the present invention, the sixth selected field intensity is 0.01–0.03 Tesla.

When the polarization of sample 10 is maintained as indicated at 118, switching valve 68 is returned to the first position to pressurize pneumatic tube 12. Sample holder 14 is pneumatically transported back to upper end portion 16 and into the magnetic field of a seventh selected field intensity as indicated at 120. In a preferred embodiment of the present invention, the seventh selected field intensity may be identical to the first selected field intensity produced by superconducting magnet 18, or 4.2 Tesla. When sample 100 is returned to the high magnetic field, a resonance detection is conventionally made by resonance detection coil 93. The resonance detection is known in conventional NMR techniques. To complete the cycle, shielding magnet 22 and rapid shut off magnet 96 are turned off.

The above-described cycle is repeated for various increments of time $t_1$, and resonance detection is made for each increment. The resonance values detected are processed by a data processing means (not shown), such as a computer, to convert the detected spectrum to a Fourier-transform spectrum. The Fourier-transform spectrum is a frequency domain spectrum which illustrates the discrete frequencies detected which allows the determination of the molecular structure of sample 100 to be made. A Fourier-transform spectrum is fully described in the above-described publication, but is briefly set forth herein.

When the sample is returned to high field for detection, a high field signal $S(t_1)$ is attained. Fourier-transformation of $S(t_1)$ results in a zero field spectrum with the full sensitivity of high field detection.

The apparatus and method of the present invention is not limited as hereinabove described. For example, the initial magnetization of the sample could be produced by other means, for example cross polarization or optical nuclear polarization of the sample. The initial order also need not be magnetization but could instead be other types of polarization, such as high field or zero field dipolar (or multipolar) order or coherent superpositions of spin states. What is important to the present invention, is that the sudden field transient to which the sample 100 is subjected creates a transient oscillation containing the frequencies characteristic of the spin system at zero field.

Furthermore, the apparatus of the present invention need not be limited to the pneumatic tube system hereinabove described. The pneumatic tube system is one particular means well adapted for creating the sudden and precisely controlled field transients. However, mechanical transport is but one approach. An alternative approach would be the quenching or cancelization of the initial polarizing field 106 by the switching of electromagnets and maintaining sample holder 14 in the stationary position Such an approach would have the advantage that the sample remains stationary and could be subjected to variations in pressure, temperature or orientation or oscillating field. These variation all have established uses in magnetic resonance spectroscopy. Furthermore, ferromagnetic or superconducting magnetic shields are an alternative to the shielding magnet 22 for obtaining the zero field condition. Shielding magnet 22 may also comprise two coils 122 and 124 connected in series with a gap 126 therebetween. The position of gap 126 enables the field to be structured for optimum shielding.

Furthermore, a condition of zero field need not exist entirely for the selected time period $t_1$. During time, $t_1$, the application of a magnetic field may alternate in time or in direction as a useful modification. These modifications could be used to further simplify the spectrum obtained by Fourier-transform by selectively decoupling certain of the spin interactions while maintaining the homogeneous character of the spectrum in zero DC field.

Furthermore, the period of zero field may not be a simple continuous period but may be broken into subperiods which are separated by the application of a magnetic field or some other perturbation. The subperiods may be independently varied in time and a Fourier-transformation performed with the data obtained during each subperiod, thereby increasing the information and content in analogy to known high field methods of two dimensional NMR.

Other modifications to the present invention, which are within the ordinary skill of the art, are that the nuclear magnetization need not be detected by standard pulsed NMR methods upon return of the sample to the high fields. Other alternative methods of detection are possible. For example, continuous wave or adiabatic passage methods of high field detection could be used. Also the detection field 120, need not have the same value as the polarizing field 106. Also, since order is exchanged between different nuclear species during the zero field evolution period, given by time, $t^1$, and at level crossings occurring in various intermediate fields 108-112, it is possible to detect the zero fields interferogram of one species through the magnetization of a coupled species.

Also, the intermediate fields existing between the high polarization field and the zero field are not necessary to practice the present invention. The sample 100 may be subjected to zero field immediately after being subjected to the polarization. However, when shielding magnet 22 and rapid shut-off magnet 96 are realized as coils, the intermediate fields facilitate the switching of current through the coils.

It is also contemplated by the present invention that it is useful to conventionally detect directly during the zero field period, thereby eliminating the need for any tuned high field RF apparatus and shortening the data aquisition time by accumulating the zero field interferogram in real time rather than pointwise as hereinabove described.

Furthermore, the information obtained during the sampling, can be increased by having periods of coherent evolution in high field and zero field follow one another within a time not much greater than the spin relaxation times. Of particular interest in this regard is that for one variable epoch the sample is rotating continuously or in discrete hops about an axis inclined at the "magic angle", defined by cosine$^{-1}$ ($\frac{1}{3}$) to the static field direction. This epoch may then be proceeded or followed by another epoch in which the DC magnetic field, including the apparent field due to sample rotation, are cancelled to zero. Thus, the information content of the magic angle and zero field time evolution may be correlated by two dimensional Fourier-transformation.

There has been described above particular and distinct embodiments of the present invention. It is now possible for one skilled in the art to make numerous uses of and modifications to the above-described embodiments without departing from the inventive concepts disclosed herein. Accordingly, the present invention is to be defined solely by the scope of the appended claims.

What is claimed is:

1. A method for analyzing a sample comprising the steps of:
    (a) polarizing the sample within a magnetic field having a selected first field intensity;
    (b) reducing the magnetic field to a substantially zero intensity for a selected first time period;
    (c) increasing the magnetic field to a second field intensity sufficient to maintain the polarization of the sample at the value existing at the end of said first time period;
    (d) measuring the magnetization of said sample;

(e) repeating steps (a)-(d) for different durations of said first time periods; and (f) determining the Fourier-transform of said measured magnetization as a function of said selected first time period.

2. A method in accordance with claim 1 wherein said reducing step includes:

reducing the magnetic field to an intermediate intensity sufficient to maintain the polarization of the sample; and rapidly reducing said field from said intermediatre intensity to said second intensity.

3. A method as set forth in claim 2 wherein said rapidly reducing step occurs in a time which is less than the inverse of the highest frequency expected from said Fourier-transformed measured magnetization.

4. A method for analyzing a sample comprising the steps of:

(a) developing a first magnetic field;

(b) positioning said sample within said first magnetic field to polarize said sample;

(c) developing a second magnetic field sufficient to maintain the polarization of said sample;

(d) positioning said sample within said second magnetic field;

(e) reducing the magnetic field about said sample to a substantially zero field intensity less than;

(f) maintaining said substantially zero magnetic field for a selected time period;

(g) positioning said sample in a third magnetic field at the end of said selected time period;

(h) measuring the magnetization of said sample; and (i) repeating steps (a)-(h) for different selected time periods.

5. A method as set forth in claim 4 which further includes the step of:

(j) determining the Fourier-transform of the measured magnetization of said sample as a function of said selected time period.

6. An apparatus for analyzing a sample, said apparatus comprising:

means for developing a first magnetic field for polarizing said sample;

means for reducing said first magnetic field to a substantially zero field intensity for a selected time period; and means for detecting the magnetization of said sample at the end of said selected time period.

7. An apparatus as set forth in claim 6 which further comprises means for computing the Fourier-transform of the measured magnetization as a function of said selected time.

8. A method for analyzing a sample comprising the steps of:

(a) creating an ordered state in the sample by subjecting said sample to a first electromagnetic field capable of producing said ordered state;

(b) removing said first electromagnetic field and allowing said ordered state to evolve in a magnetic field of substantially zero field intensity for a selected time period;

(c) subjecting said sample to an arresting magnetic field of sufficient intensity to arrest the evolution of the magnetization of said sample;

(d) detecting the magnetization of said sample during the occurrence of said arresting magnetic field intensity;

(e) repeating steps (a)-(d) for different said selected time periods; and (f) determining the Fourier-transform of said measured magnetization as a function of said selected time period.

9. A method as set forth in claim 8 wherein said step of creating an ordered state in said sample includes:

polarizing said sample within a magnetic field of relatively high field intensity to obtain equilibrium magnetization of said sample.

10. A method as set forth in claim 8 wherein said step of creating an ordered state in said sample includes:

polarizing said sample to obtain initial magnetization of said sample by cross polarization.

11. A method for analyzing a sample comprising the steps of:

(a) creating an ordered state in said sample by subjecting said sample to a first electromagnetic field;

(b) removing said first electromagnetic field and allowing said ordered state to evolve in a magnetic field of substantially zero field intensity for a selected time interval;

(c) subjecting said sample to an arresting magnetic field of sufficient intensity to arrest the evolution of the magnetization of said sample;

(d) detecting the magnetization of said sample during the occurrence of said arresting magnetic field;

(e) repeating steps (a)-(d) for different said selected time intervals; and (f) determining the Fourier-transform of said detected magnetization as a function of said selected time interval, wherein said step of creating an ordered state in said sample includes:

polarizing said sample to obtain initial magnetization of said sample by optical nuclear polarization.

12. A method as set forth in claim 8 wherein the ordered state of said sample is magnetic polarization.

13. A method as set forth in claim 8 wherein the ordered state of said sample is high field dipolar polarization.

14. A method as set forth in claim 8 wherein the ordered state of said sample is zero field dipolar polarization.

15. A method as set forth in claim 8 wherein the ordered state of said sample is a coherent superposition of spin states.

16. A method as set forth in claim 8 wherein the ordered state of said sample is high field multipolar order.

17. A method as set forth in claim 8 wherein the ordered state of said sample is zero field multipolar order.

18. A method as set forth in claim 8 wherein said step of creating an ordered state in said sample includes:

developing a first electromagnetic field of a first field intensity;

positioning said sample within said first first electromagnetic field;

developing a magnetic field of a second field intensity sufficient to maintain any polarization produced by said first electromagnetic field;

positioning said sample within said second magnetic field.

19. A method in accordance with claim 8 wherein said selected time period is divided into sub-time periods, each sub-time period being separated by a perturbation of said substantially zero field intensity.

20. A method as set forth in claim 8 wherein said detecting step includes detecting by using pulsed NMR when said sample is subjected to said arresting magnetic field.

21. A method as set forth in claim 8 wherein said detecting step includes detecting by continuous wave detecting when said sample is subjected to said arresting magnetic field.

22. A method as set forth in claim 8 wherein said detecting step includes detecting by adiabatic passage detection when said sample is subjected to said arresting magnetic field.

23. A method for analyzing a sample comprising the steps of:
 (a) creating an ordered state in said sample by subjecting said sample to a first electromagnetic field;
 (b) removing said first electromagnetic field and allowing said ordered state to evolve in a magnetic field of substantially zero field intensity for a selected time interval;
 (c) subjecting said sample to an arresting magnetic field of sufficient intensity to arrest the evolution of the magnetization of said sample;
 (d) detecting the magnetization of said sample during the occurrence of said arresting magnetic field;
 (e) repeating steps (a)-(d) for different said selected time intervals; and
 (f) determining the Fourier-transform of said detected magnetization as a function of said selected time interval, wherein
said detecting step includes detecting said magnetization in said substantially zero magnetic field and
further detecting said magnetization of said sample during said arresting magnetic field as a function of time; and
comparing the Fourier transform of said magnetization in said substantially zero magnetic field produced during said substantially zero magnetic field detecting with the Fourier transform of said magnetization produced during said arresting magnetic field detecting.

24. An apparatus as set forth in claim 6 wherein said means for reducing said first magnetic field comprises means for reducing the magnetic field in said sample to a second magnetic field intensity sufficient to maintain the polarization produced by said first magnetic field.

25. An apparatus as set forth in claim 6 wherein said means for determining magnetization comprises:
 means for subjecting said sample to a magnetic field of sufficient intensity to arrest the evolution of said polarization; and
 means for measuring the magnetization of said sample after said evolution is so arrested, said means including nuclear magnetic resonance means.

26. An apparatus as set forth in claim 6 wherein said means for developing a first magnetic field includes means for developing an a magnetic field which varies in time and direction.

27. An apparatus as set forth in claim 6 wherein said means for developing a first magnetic field includes means for developing an an electromagnetic field which varies in time and direction.

28. A method as set forth in claim 8 further comprising the step of
 (f) determining the Fourier-transform of said measured magnetization as a function of said selected time interval.

29. A method as set forth in claim 8 wherein said step of detecting the magnetization of said sample further comprises measuring the magnetization of said sample by nuclear magnetic resonance means as a function of a detection time related to the time at which said sample is placed in said arresting magnetic field and wherein said method further comprising the steps of calculating the two dimensional Fourier transform of the said measured magnetization as a function of said detection time and said selected time interval.

* * * * *

UNITED STATES PATENT AND TRADEMARK OFFICE
CERTIFICATE OF CORRECTION

PATENT NO. : 4,710,714

DATED : December 1, 1987

INVENTOR(S) : Daniel P. Weitekamp et al.

It is certified that error appears in the above-identified patent and that said Letters Patent is hereby corrected as shown below:

Column 3, line 38, "inter alia" should be in italics.

Column 6, line 56, delete "10" and insert therefor --100--.

Column 7, line 41, between "position Such" insert --.--.

Signed and Sealed this

Twenty-third Day of August, 1988

Attest:

DONALD J. QUIGG

*Attesting Officer*      *Commissioner of Patents and Trademarks*